United States Patent
Tomioka

[19]

[11] Patent Number: 5,968,181
[45] Date of Patent: Oct. 19, 1999

[54] ONE-CHIP CLOCK SYNCHRONIZED MEMORY DEVICE

[75] Inventor: Takanori Tomioka, Tokyo, Japan

[73] Assignee: Mitsubishi Denki Kabushiki Kaisha, Tokyo, Japan

[21] Appl. No.: 09/018,344

[22] Filed: Feb. 4, 1998

[30] Foreign Application Priority Data

Aug. 11, 1997 [JP] Japan ................................ 9-216696

[51] Int. Cl.⁶ .................................................. G06F 12/00
[52] U.S. Cl. .......................................... 713/600; 711/170
[58] Field of Search .................................. 713/400, 600; 711/170–173; 710/52, 56

[56] References Cited

U.S. PATENT DOCUMENTS

| | | | |
|---|---|---|---|
| 4,949,244 | 8/1990 | Kubo et al. | 711/3 |
| 5,317,714 | 5/1994 | Nakagawa et al. | 711/115 |
| 5,727,232 | 3/1998 | Iida et al. | 710/56 |

FOREIGN PATENT DOCUMENTS

| | | |
|---|---|---|
| 61-155876 | 7/1986 | Japan . |
| 6-194421 | 7/1994 | Japan . |

*Primary Examiner*—Thomas M. Heckler
*Attorney, Agent, or Firm*—McDermott, Will & Emery

[57] ABSTRACT

A one-chip clock synchronized memory device comprises a memory constituted by an ordinary data storage area and a sequence storage area. The sequence storage area sequentially stores logic sequence data including control signals, data signals and address signals. A data area control circuit controls reading and writing of data to and from the ordinary data storage area. Logic sequence data storage means receives logic sequence data and writes the received data to the sequence storage area. The memory device is characterized by its ability to accommodate input data sequentially as logic sequence data while performing ordinary data storage operations.

7 Claims, 8 Drawing Sheets

8  Memory control signal input pins
9  Address signal input pins
10 Data signal input/output pins
11 Clock input pins
12 Parallel bus 8  Memory control signal input pins
9  Address signal input pins
10 Data signal input/output pins
11 Clock input pins
12 Parallel bus

ONE-CHIP CLOCK SYNCHRONIZED MEMORY DEVICE

BACKGROUND OF THE INVENTION

1. Field of the Invention

The present invention relates to a one-chip clock synchronized memory device having a memory with a built-in logic analyzer function capable of accurately analyzing operations of a memory inside a system in operation.

2. Background Art

A presumably failed clock synchronized memory device of the above type held in systems has been analyzed by a logic analyzer for operation, with probes attached to the memory pins for control signals, address signals and data signals. The timings of these signals are observed so that suspected signals may be detected by the logic analyzer. A minimum of 30 to 40 probes would be needed optimally to carry out such verifications, except that functional and physical constraints of the logic analyzer often limit the number of probes to less than 20. The 10-odd probes thus selected are used conventionally to check and analyze the signals of the memory in question.

Recently introduced systems, for example, personal computers (PC), are noted for their complicated functionality, combined with a large-scale memory. Such as a 168-pin module memory. To analyze operations of such a memory accurately would require setting up nearly 160 probes for attachment to memory pins. In cases where two 168-pin modules are installed in a system, the need has been recognized to prepare as many as 320 pins for analyzing operations of the incorporated memories. That need is acutely felt during attempts to analyze a failure that is detectable only when an application program is run on the system.

As outlined above, memory failures in systems are analyzed conventionally by the logic analyzer with probes attached to memory pins. However, setting up a large number of probes needed for the check has often turned out to be impractical, as well as costly.

Furthermore, there has been a growing need to efficiently and accurately analyze for the failure of systems containing clock synchronized memory chips that are higher in operating speed and more complex than ever in structure.

SUMMARY OF THE INVENTION

It is therefore an object of the present invention to overcome the above and other deficiencies of the prior art, and to provide a clock synchronized memory device using a memory incorporating a logic analyzer function.

In achieving the foregoing and other objects of the present invention and according to one aspect thereof, there is provided a one-chip clock synchronized memory device incorporating a logic analyzer function whereby system operations are analyzed accurately, easily and efficiently.

According to one aspect of the present invention, an one-chip clock synchronized memory device comprises a memory constituted by an ordinary data storage area and a sequence storage area, and the sequence storage area sequentially storing logic sequence data including control signals, data signals and address signals. A data area control circuit is provided for controlling writing and reading of data to and from the ordinary data storage area. Further, logic sequence data storage means is provided for receiving logic sequence data and writing the received data to the sequence storage area.

In another aspect of the present invention, in the one-chip clock synchronized memory device, the logic sequence data storage means comprises a register for temporarily accommodating logic sequence data; a register transfer control circuit for controlling the transfer of the data of the register to the sequence storage area; a row-column address counter for indicating the address in the sequence storage area to which the logic sequence data are to be written; and a comparator for comparing sequentially input data in the register with desired logic sequence data for triggering data writing.

In another aspect of the present invention, the one-chip clock synchronized memory device further comprises sequence storage area setting means for setting the size of the sequence storage area.

In another aspect of the present invention, in the one-chip clock synchronized memory device, the sequence storage area setting means includes a row-column address counter in which a start address of the sequence storage means is set upon establishment of a mode register.

In another aspect of the present invention, in the one-chip clock synchronized memory device, the sequence storage area setting means includes start address reading means used when a memory module made of an EEPROM is employed, and the start address reading means retrieves a start address from the EEPROM and sets the retrieved address to the row-column address counter.

In another aspect of the present invention, in the one-chip clock synchronized memory device, the logic sequence data storage means sequentially transfers the logic sequence data to the sequence storage area in units of clock pulses.

Other and further objects, features and advantages of the invention will appear more fully from the following description.

BEST MODE OF CARRYING OUT THE INVENTION

Preferred embodiments of the invention will now be described in detail with reference to the accompanying drawings of FIGS. 1 through 8.

First Embodiment

A one-chip clock synchronized memory device practiced as a first embodiment of the invention is described below with reference to FIGS. 1 through 5.

Figure 1:
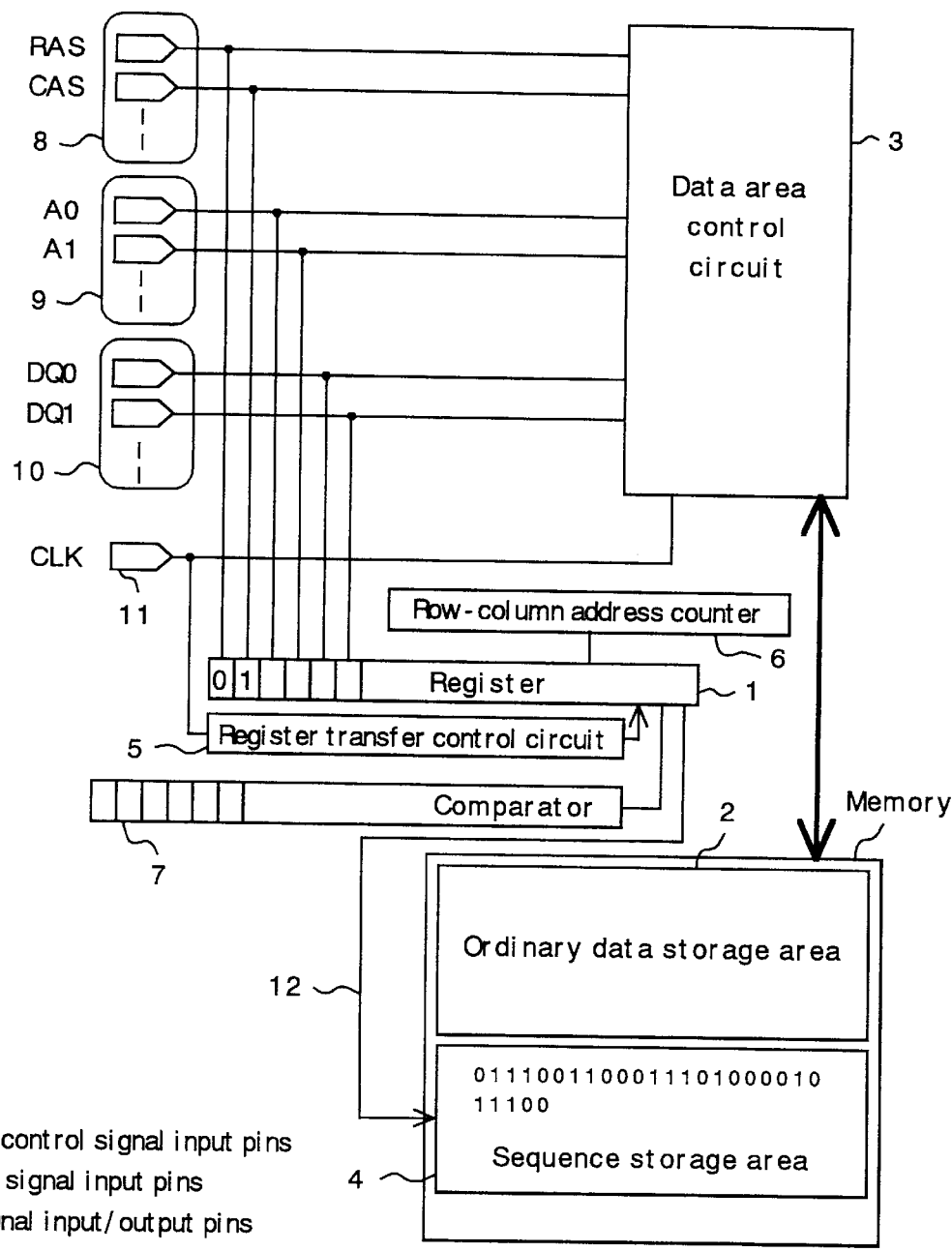
FIG. 1 is a block diagram of a one-chip clock synchronized memory device incorporating a logic analyzer function according to a first embodiment of the present invention.

FIG. 1 is a block diagram of a one-chip clock synchronized memory device practiced as the first embodiment incorporating a logic analyzer function with a memory including a logic sequence storage capability. In FIG. 1, reference numeral 1 is a register that temporarily accommodates logic sequence data (logic data expressed in sequence) such as control signals, address signals and data signals; 2 is an ordinary data storage area in the memory; 3 is a data area control circuit for controlling writing and reading of data to and from the data storage area 2; 4 is a sequence storage area which implements the logic sequence storage capability of the memory, and when separated from the data storage area 2, stores sequentially logic sequence data including the control signal, address signal and data signal (i.e., the signals are stored sequentially in the order in which they were input); and 5 is a register transfer control circuit for controlling the transfer of the contents of the register 1 to the sequence storage area 4.

Reference numeral 6 is a row-column address counter indicating the row and column to which the logic sequence data should be written in the sequence storage area 4; 7 is a comparator which receives logic sequence data to be triggered (as will be described later) for comparison with sequentially input data in the register 1 and which effects a trigger in the event of a match; 8 is a group of as many as "n" memory control signal input pins for receiving externally supplied memory control signals such as RAS and CAS; 9 is a group of "m" address signal input pins for receiving externally supplied address signals (A0, A1, etc.); 10 is a group of "p" data signal input/output pins for inputting and outputting data signals for the memory device; 11 is a clock (CLK) input pin for receiving an externally supplied clock signal according to which the memory device operates; and 12 is a parallel bus that is (n+M+p) wide and connects the register 1 with the sequence storage area 4. The register 1, register transfer control circuit 5, row-column address counter 6, comparator 7 and sequence storage area 4 of the memory make up logic sequence data storage means, which in turn constitutes part of the logic analyzer function in the one-chip clock synchronized memory device.

Figure 2:
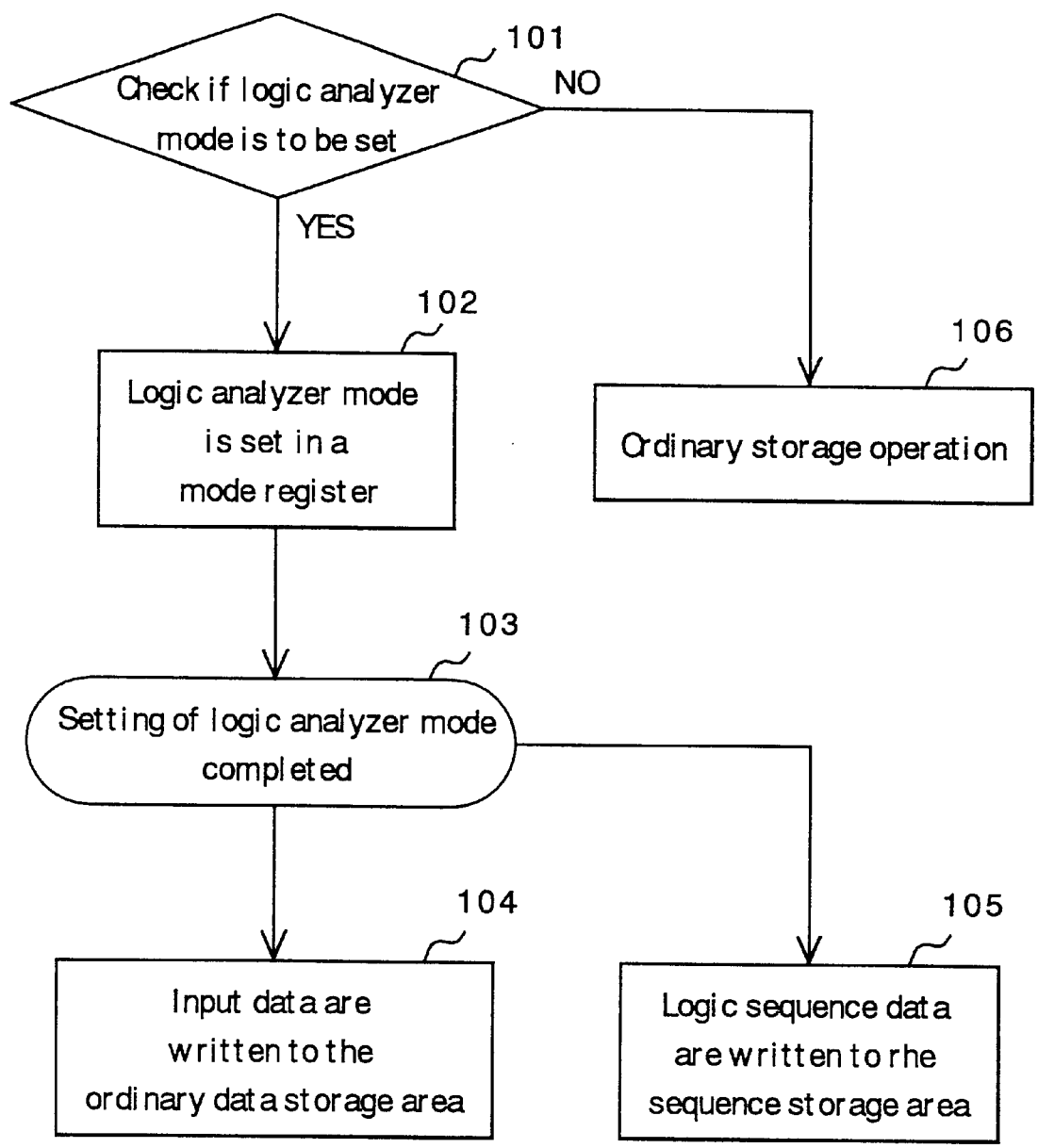
FIG. 2 is a flowchart of steps in which the one-chip clock synchronized memory device of FIG. 1 is set in logic analyzer mode.

Described below with reference to FIGS. 1 and 2 is how the one-chip clock synchronized memory device incorporating the logic analyzer function works as the first embodiment of the present invention. FIG. 2 is a flowchart of steps in which to set the one-chip clock synchronized memory device of the first embodiment in logic analyzer mode. In step 101 of FIG. 2, a check is made to see if logic analyzer mode is to be set. If logic analyzer mode is not to be set up, an ordinary storage operation is carried out in step 106. If logic analyzer mode is to be set, step 102 is executed. In step 102, logic analyzer mode is set in a mode register (not shown, located outside the memory device). With the setting of logic analyzer mode completed in step 103, input data is written to the ordinary data storage area 2 (step 104), and logic sequence data is written to the sequence storage area 4 (step 105). If the memory device is to serve only as an ordinary memory, the memory is used without logic analyzer mode being established.

For example, a mode register may be set for a synchronous DRAM (SDRAM) before the start of memory operation. In that case, logic analyzer mode is set in the mode register. The setting of logic analyzer mode is performed by the CPU (not shown) which also writes logic sequence data to the sequence storage area 4, as will be described later. In the first embodiment, the sequence storage area 4 is fixed in size. There is no need to set the size of the ordinary data storage area 2, or that of the sequence storage area 4. A setup in which the sequence storage area 4 is varied in size will be described in connection with a second embodiment. Below is a description of what takes place after logic analyzer mode has been established.

Figure 3:
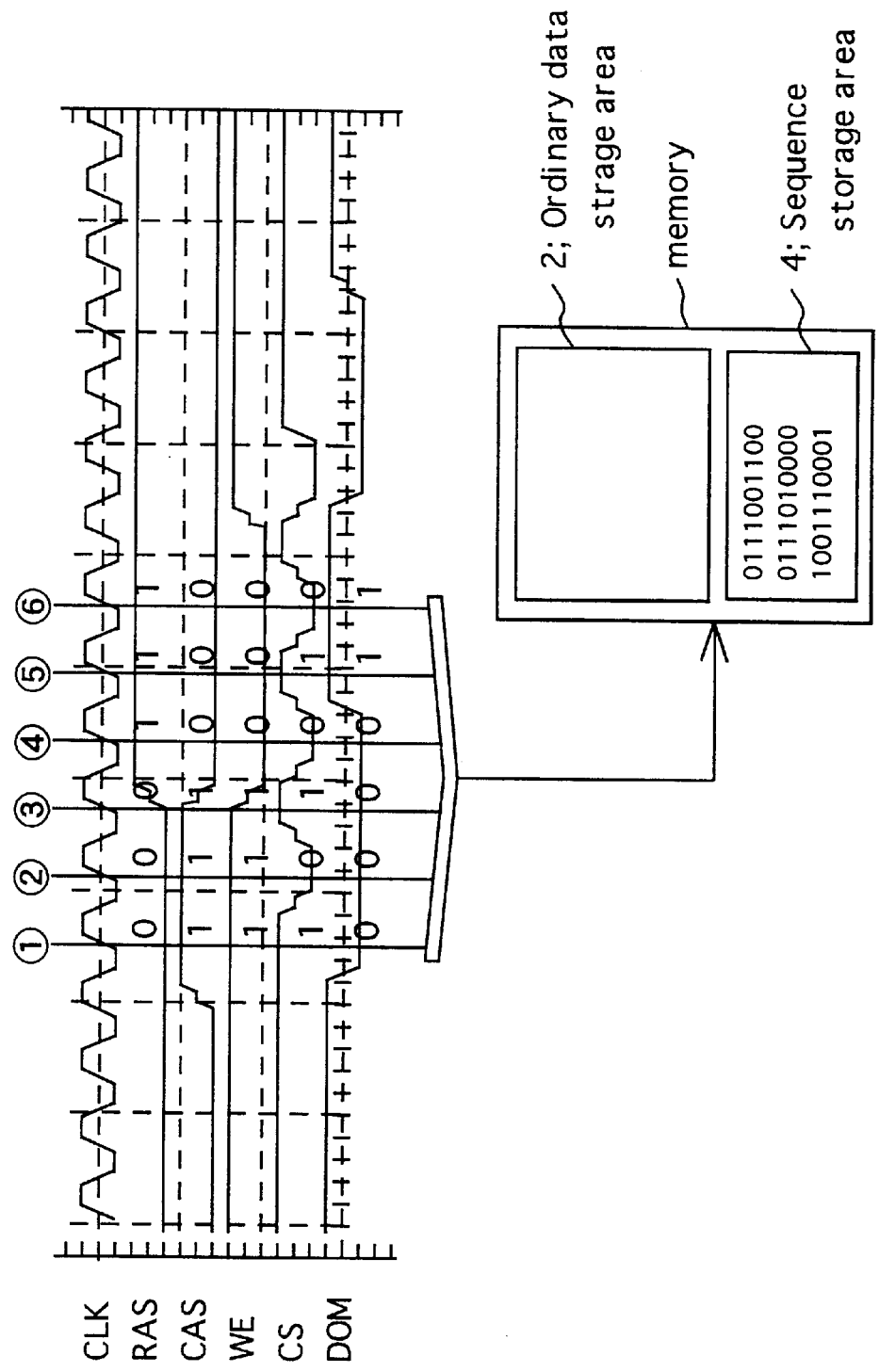
FIG. 3 is a schematic view showing typical workings of a synchronous DRAM (SDRAM) which, furnished with a built-in logic analyzer function, acts as the memory device of FIG. 1.

FIG. 3 illustrates typical workings of a synchronous DRAM (SDRAM) which incorporates the logic analyzer function and serves as the memory device of the first embodiment. Setting logic analyzer mode for this SDRAM activates the register 1, register transfer control circuit 5, row-column address counter 6 and comparator 7, whereby logic sequence data to be written to the sequence storage area 4 is controlled. At each leading edge of the clock signal CLK, control signals, address signals and data signals received through the memory control signal input pins 8, address signal input pins 9 and data signal input pins 10 are admitted to the register 1. The admitted data are stored as logic sequence data into the sequence storage area 4 sequentially in units of clock pulses.

More specifically, as shown in FIG. 3, the logic data of control signals, data signals, etc., (RAS, CAS, WE, CS, DQM) are composed of (0, 1, 1, 1, 0) at a point (1) in time. Similarly, the logic data at subsequent points in time (2), (3), (4), (5) and (6) are made of (0, 1, 1, 0, 0) , (0, 1, 1, 1, 0), (1, 0, 0, 0, 0) , (1, 0, 0, 1, 1) and (1, 0, 0, 0, 1) , respectively. Such logic sequence data are written to the sequence storage area 4 established in the memory. With the logic sequence data written to and read from the memory, the memory operation is analyzed by use of the data. This eliminates the need for attaching probes to all pins of the memory as in conventional setups, whereby the target memory is analyzed for operation accurately, easily and efficiently.

What follows is a description of how logic sequence data are written to the sequence storage area 4.

A first data writing method involves writing logic sequence data items per clock pulse, as in the case of the above-described SDRAM. Specifically, control signals, address signals and data signals are input to the ordinary data area control circuit 3 and to the register 1 concurrently. The logic sequence data placed in the register 1 are transferred from there to the sequence storage area 4 for storage under control of the register transfer control circuit 5.

Every time a logic sequence data item is stored, the row-column address counter 6 is incremented. This makes it possible to establish and identify the row and column in which each data item has been set in the sequence storage area 4. When logic sequence data have been written up to the last address of the area, the writing of the data is resumed from the start address. Memory operations on the ordinary data storage area 2 are continued while the logic sequence data are being written to the sequence storage area 4.

A second data writing method will now be described with reference to FIG. 3. This method involves admitting only the logic sequence data corresponding to effective commands. In the example of FIG. 3, the logic sequence data of (0, 1, 1, 0, 0), (1, 0, 0, 0, 0) and (1, 0, 0, 0, 1) are effective only at points (2), (4) and (6) in time where the signal CS (Chip Select) is Low. Such logic sequence data alone are transferred to the sequence storage area 4.

Figure 4:
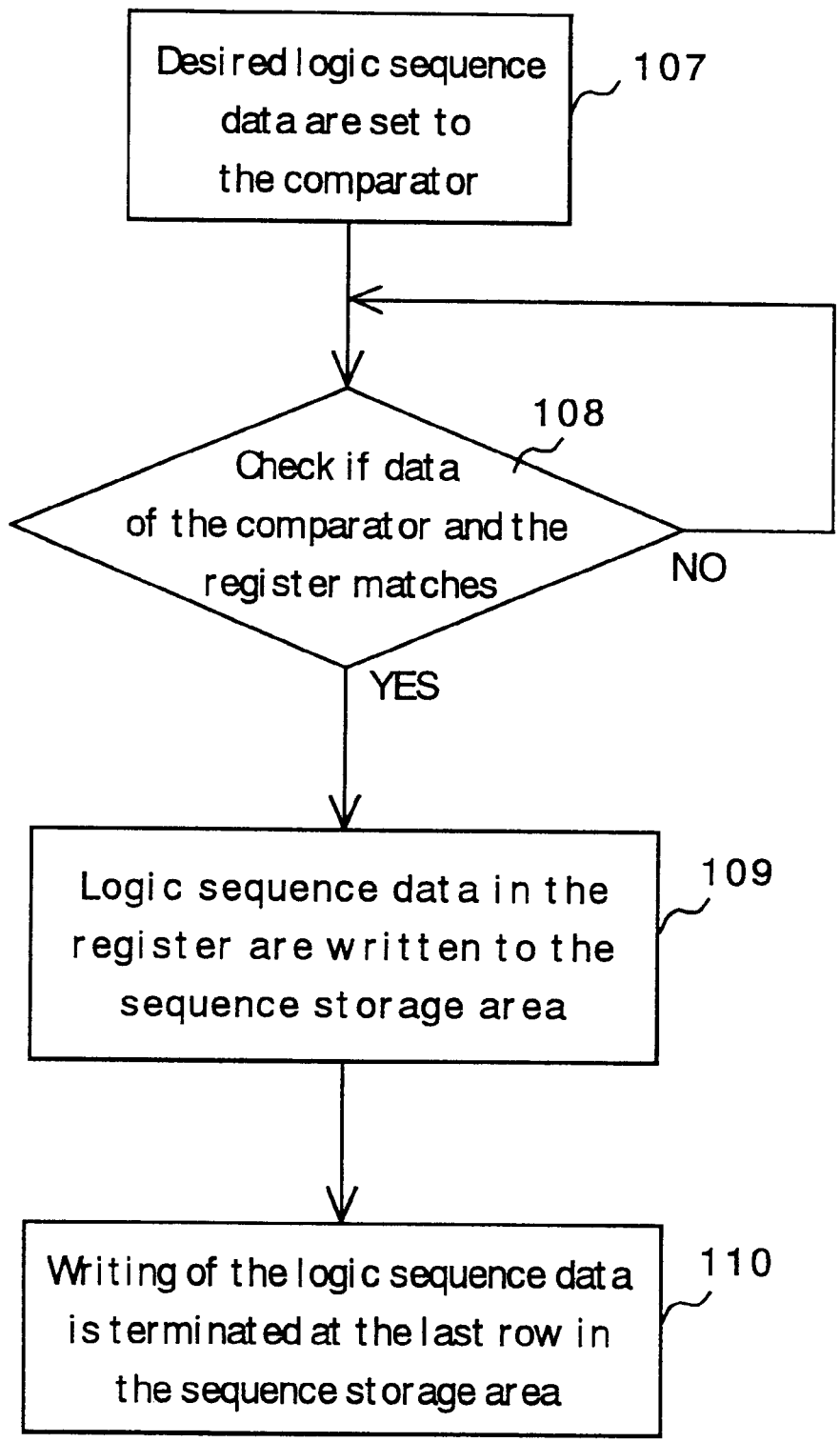
FIG. 4 is a flowchart of steps in which the one-chip clock synchronized memory device of FIG. 1 is triggered by a command into an operation for storing logic sequence data.

A third data writing method will now be described with reference to FIG. 4. This method involves getting the CPU (not shown) to trigger a write operation using a command so that triggered logic sequence data alone will be admitted to the sequence storage area 4. FIG. 4 is a flowchart of steps constituting the third data writing method by which to write logic sequence data after a write operation is triggered using a command. How a write operation is triggered will be described below.

In step 107 of FIG. 4, desired logic sequence data are set to the comparator 7. In step 108, a check is made by the comparator 7 to see if its content matches the logic sequence data in the register 1. In the event of a mismatch, another comparison is made with the next data. If a match is made, step 109 is reached in which the logic sequence data in the register 1 start being written to the sequence storage area 4. When the write operation has reached the last row in the sequence storage area 4 as counted by the row-column address counter 6, the writing of the logic sequence data is terminated (step 110).

Figure 5:
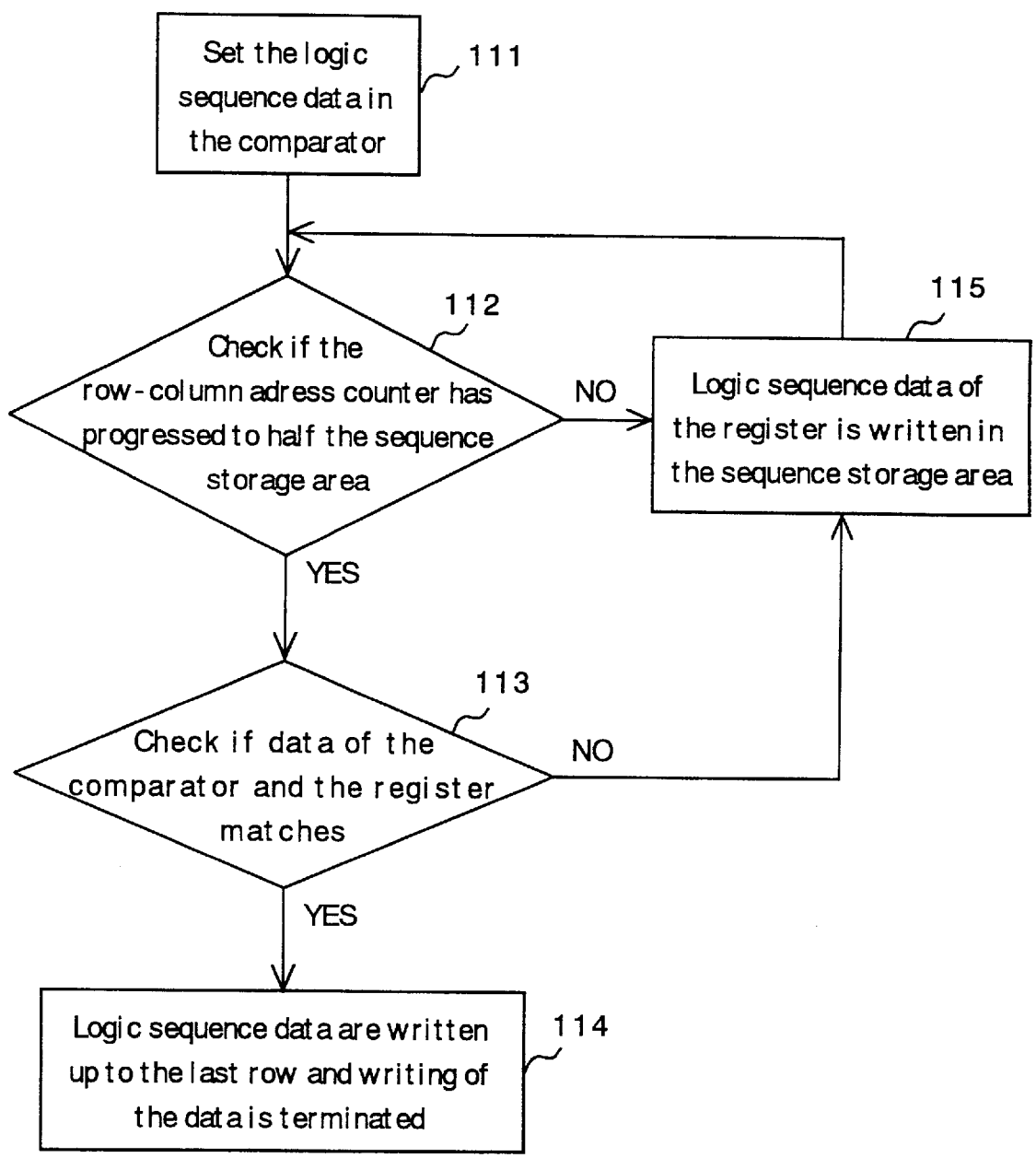
FIG. 5 is a flowchart of steps in which the one-chip clock synchronized memory device of FIG. 1 is triggered by a command into an operation for storing logic sequence data in effect before and after the trigger application.

A fourth data writing method will now be described with reference to FIG. 5. This method involves getting the CPU (not shown) to write to the sequence storage area 4 both the logic sequence data admitted before a write operation is triggered using a command, and the logic sequence data admitted after the write operation is triggered at a given point in time by the CPU. FIG. 5 is a flowchart of steps constituting the fourth data writing method by which to write the logic sequence data in effect before and after a point in time at which a write operation is triggered using a command.

In step 111, the logic sequence data to be detected is set in the comparator 7, and the writing of logic sequence data is started. In step 112, a check is made to see if the row-column address counter 6 has progressed to half the sequence storage area 4. If the counter 6 is found to have reached the midpoint of the area 4, step 113 is reached. In step 113, a check is made to see if the, content of the comparator 7 matches that of the register 1. In the event of a match, the logic sequence data are written up to the last row and the writing of the data is terminated (step 114).

In the case of a mismatch in content between the comparator 7 and the register 1 in step 113, step 115 is reached in which the writing of the logic sequence data is allowed to reach the last row and is resumed from the start address, with a trigger again effected as described above. To read the logic sequence data from the sequence storage area 4 requires that logic analyzer mode be removed, and that the data be read via the data pins (DQ) like ordinary data signals.

Second Embodiment

Figure 6:
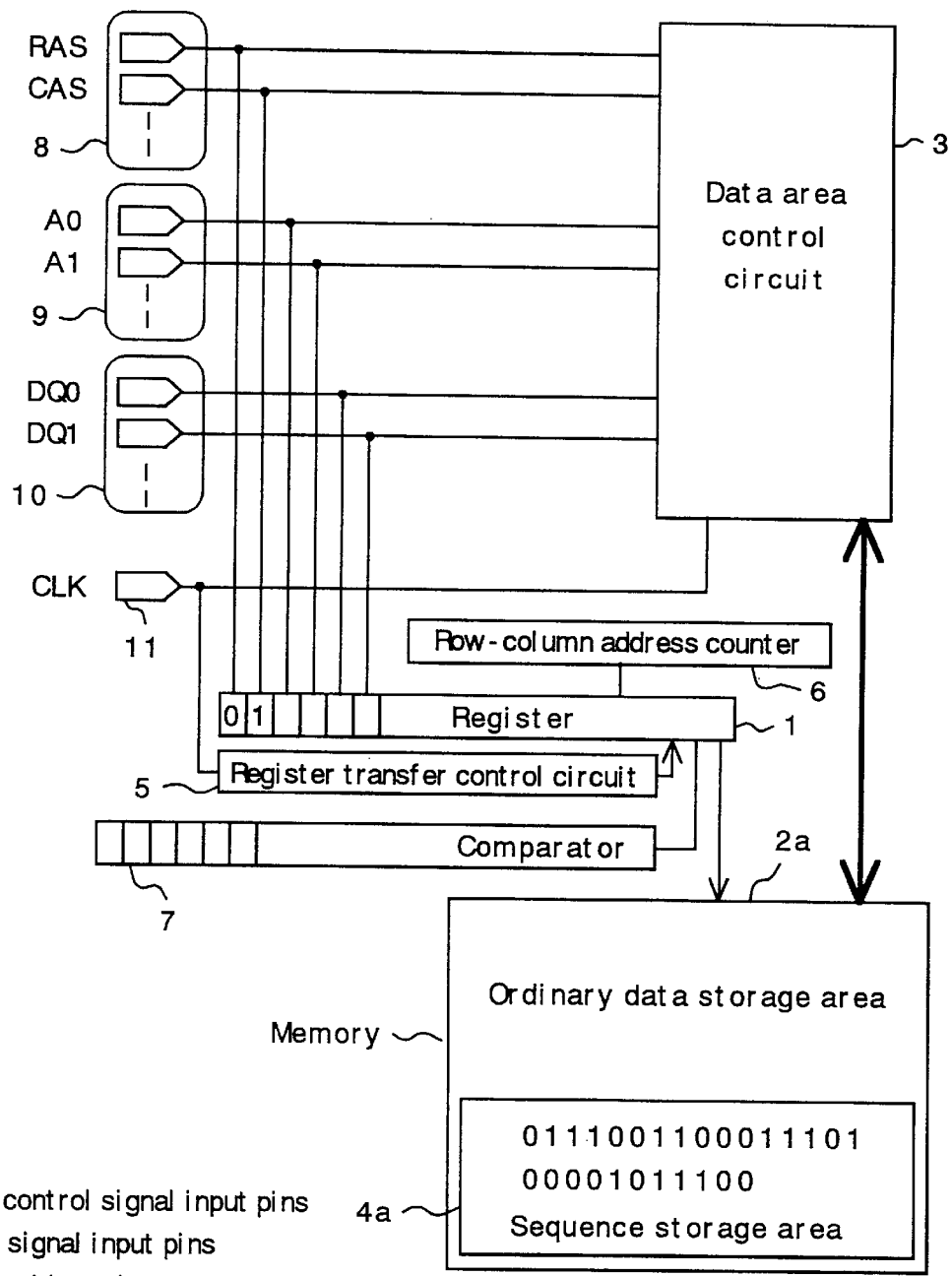
FIG. 6 is a block diagram of a one-chip clock synchronized memory device incorporating the logic analyzer function and practiced as the second embodiment of the present invention.
Figure 7:
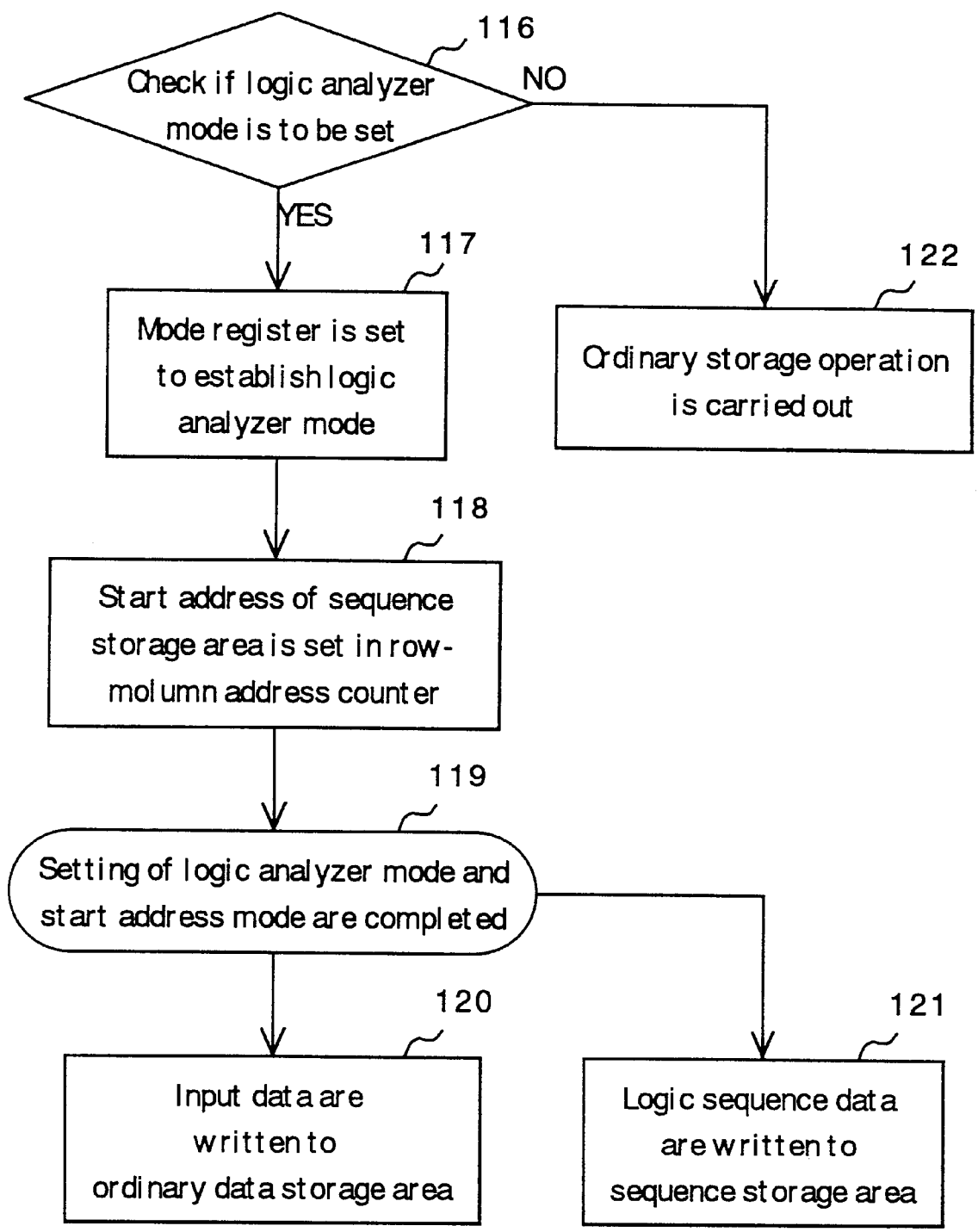
FIG. 7 is a flowchart of steps in which to set up a sequence storage area in the one-chip clock synchronized memory device of FIG. 6.
Figure 8:
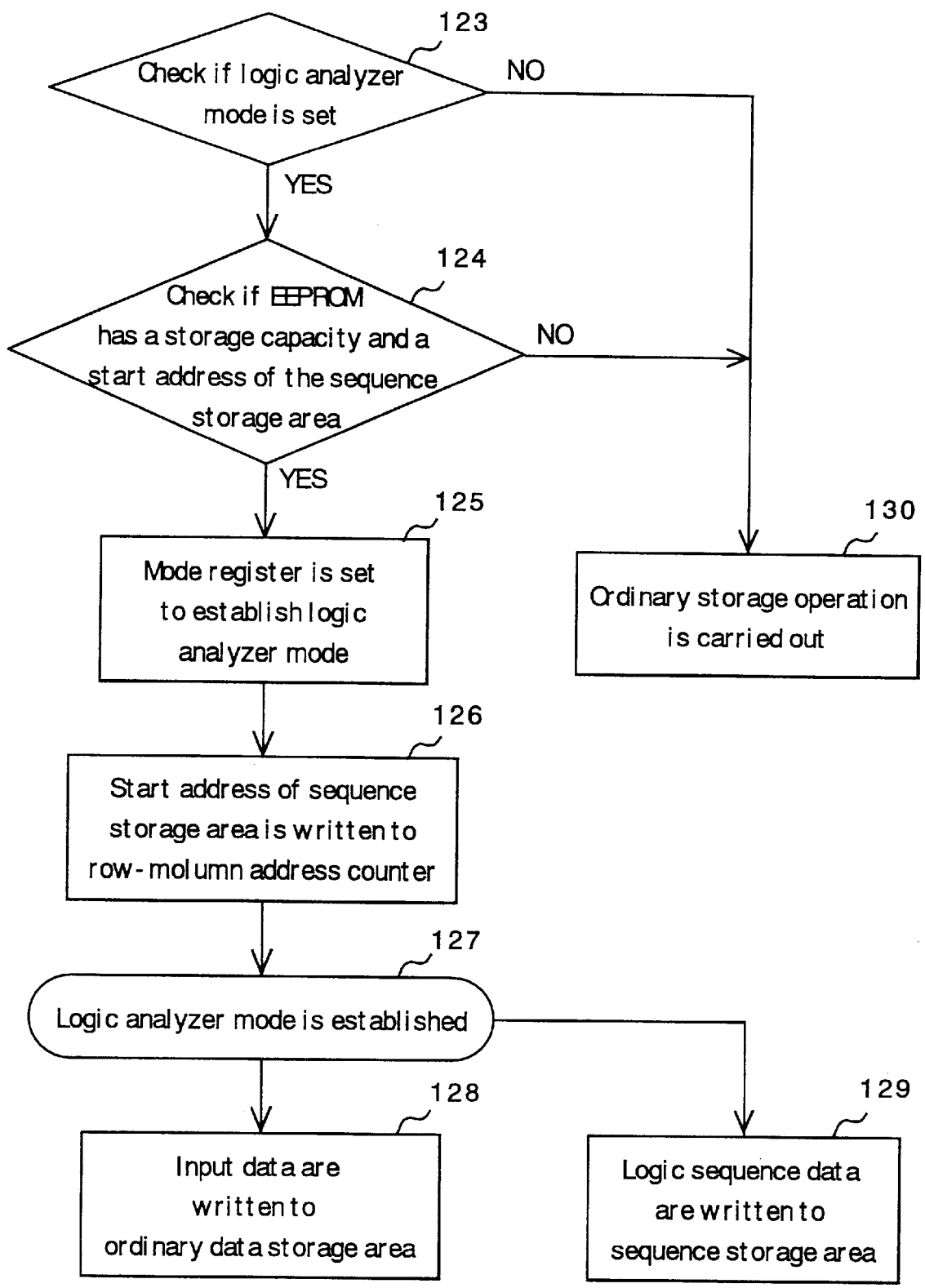
FIG. 8 is a flowchart of steps in which to establish a sequence storage area in the one-chip clock synchronized memory device of FIG. 6 mounted on a memory module.

A one-chip clock synchronized memory device practiced as a second embodiment of the invention including a logic analyzer function is described below in detail with reference to FIGS. 6 through 8. FIG. 6 is a block diagram of a one-chip clock synchronized memory device incorporating the logic analyzer function, and practiced as the second embodiment. FIG. 7 is a flowchart of steps in which to set up a sequence storage area in the one-chip clock synchronized memory device of FIG. 6. FIG. 8 is a flowchart of steps in which to establish a sequence storage area in the one-chip clock synchronized memory device of FIG. 6 when the latter is mounted on a memory module.

Of the reference numerals in FIG. 6, those already used in FIG. 1 designate like or corresponding parts and such parts will not be described further. Reference numeral 2a represents an ordinary data storage area, and 4a denotes a sequence storage area which, set up in the ordinary data storage area 2a, may be changed in size. The register 1, register transfer control circuit 5, row-column address counter 6, comparator 7 and sequence storage area 4a of the memory make up logic sequence data storage means, which in turn constitutes part of the logic analyzer function in the one-chip clock synchronized memory device. In the second embodiment, the row-column address counter 6 constitutes sequence storage area setting means for setting a start address and a storage capacity of the sequence storage area 4a in the memory. Changing set-points in the row-column address counter 6 varies the size of the sequence storage area 4a.

How the sequence storage area 4a is established will now be described with reference to FIG. 7. In the example of FIG. 7, a mode register (not shown) is set under control of the CPU (not shown) with set-points not only for establishing logic analyzer mode, but also for designating a start row address and a start column address which determine the size of the sequence storage area 4a. How the settings are made is described below.

In step 116 of FIG. 7, a check is made to see if logic analyzer mode is to be set. If logic analyzer mode is not to be set, an ordinary storage operation is carried out in step 122. If logic analyzer mode is to be set up, the mode register is set so as to establish logic analyzer mode in step 117. In step 118, a start address of the sequence storage area 4a is set in the row-column address counter 6. When the setting of logic analyzer mode and that of the start address mode are completed in step 119, input data are written to the ordinary data storage area 2a (step 120) and logic sequence data are written to the sequence storage area 4a (step 121).

How the sequence storage area 4a is otherwise established will now be described with reference to FIG. 8. The way of setting up the sequence storage area 4a, as shown in FIG. 8, constitutes an inventive method for determining a start address and a storage capacity of the sequence storage area 4a in the one-chip clock synchronized memory device when the latter is mounted on a memory module. If the memory module is an SDRAM-mounted module, it comprises an EEPROM that stores attribute data of the module. In such a case, the storage capacity and start address of the sequence storage area 4a are written beforehand to the EEPROM. When logic analyzer mode is entered, these preset data are retrieved from the EEPROM and written to the row-column address counter 6. The necessary means for retrieving the start address from the EEPROM and setting the retrieved address to the row-column address counter 6 under control of the CPU may be implemented either by hardware or by software. The operations other than those described here are the same as those for setting logic analyzer mode as shown in FIG. 2.

If logic analyzer mode is not to be set up in step 123 of FIG. 8, an ordinary storage operation is carried out in step 130. If logic analyzer mode is to be set, step 124 is executed. In step 124, a check is made to see if the EEPROM has a storage capacity and a start address of the sequence storage area 4a preset therein. If no preset data are found in the EEPROM, step 130 is reached in which an ordinary storage operation is performed. If preset data are detected in the EEPROM, step 125 is executed. In step 125, the mode register is set so as to establish logic analyzer mode. In step 126, the start address of the sequence storage area 4a is written to the row-column address counter 6. When the establishment of logic analyzer mode is completed in step 127, input data are written to the ordinary data storage area 2a (step 128), and logic sequence data are written to the sequence storage area 4a (step 129).

The present invention had the effects and advantages as follows. As described, the one-chip clock synchronized memory device of the present invention incorporates the logic analyzer function by which to analyze system operations accurately, easily and efficiently. In addition, the inventive memory device allows the ordinary data storage area and sequence storage area to be varied in size by reprogramming, whereby failure analysis of the system in operation is carried out easily and effectively.

Many modifications and variations of the present invention are possible in the light of the above teachings. It is therefore to be understood that within the scope of the appended claims the invention may by practiced otherwise than as specifically described.

What is claimed is:

1. A one-chip clock synchronized memory device comprising:

a memory constituted by an ordinary data storage area and a sequence storage area, said sequence storage area sequentially storing logic sequence data including control signals, data signals and address signals;

a data area control circuit for controlling writing and reading of data to and from said ordinary data storage area; and logic sequence data storage means for receiving logic sequence data and writing the received data to said sequence storage area.

2. The one-chip clock synchronized memory device according to claim 1, wherein said logic sequence data storage means comprises:

a register for temporarily accommodating logic sequence data;

a register transfer control circuit for controlling the transfer of the data of said register to said sequence storage area;

a row-column address counter for indicating the address in said sequence storage area to which the logic sequence data are to be written; and a comparator for comparing sequentially input data in said register with desired logic sequence data for triggering data writing.

3. The one-chip clock synchronized memory device according to claim 1, wherein said logic sequence data storage means sequentially transfers said logic sequence data to said sequence storage area in units of clock pulses.

4. The one-chip clock synchronized memory device according to claim 1 further comprising sequence storage area setting means for setting the size of said sequence storage area.

5. The one-chip clock synchronized memory device according to claim 4, wherein said sequence storage area setting means includes a row-column address counter in which a start address of said sequence storage means is set upon establishment of a mode register.

6. The one-chip clock synchronized memory device according to claim 4, wherein said sequence storage area setting means includes start address reading means used when a memory module made of an EEPROM is employed, said start address reading means retrieving a start address from said EEPROM and setting the retrieved address to said row-column address counter.

7. The one-chip clock synchronized memory device according to claim 4, wherein said logic sequence data storage means sequentially transfers said logic sequence data to said sequence storage area in units of clock pulses.

* * * * *